(12) United States Patent
Yoo et al.

(10) Patent No.: US 7,923,749 B2
(45) Date of Patent: Apr. 12, 2011

(54) III-NITRIDE COMPOUND SEMICONDUCTOR LIGHT EMITTING DEVICE

(75) Inventors: Tae Kyung Yoo, Kyunggi-do (KR); Eun Hyun Park, Kyunggi-do (KR)

(73) Assignee: EipValley Co., Ltd., Koomi (KR)

( * ) Notice: Subject to any disclaimer, the term of this patent is extended or adjusted under 35 U.S.C. 154(b) by 1206 days.

(21) Appl. No.: 10/599,232

(22) PCT Filed: Mar. 25, 2005

(86) PCT No.: PCT/KR2005/000895
§ 371 (c)(1),
(2), (4) Date: Oct. 23, 2006

(87) PCT Pub. No.: WO2006/004271
PCT Pub. Date: Jan. 12, 2006

(65) Prior Publication Data
US 2008/0283865 A1    Nov. 20, 2008

(30) Foreign Application Priority Data
Mar. 25, 2004  (KR) .................. 10-2004-0020270

(51) Int. Cl.
*H01L 33/00* (2010.01)
(52) U.S. Cl. .................. 257/103; 257/98; 257/E33.001; 257/E33.067; 257/E33.074
(58) Field of Classification Search .............. 257/98, 257/103, E33.001, E33.067, E33.068, E33.074
See application file for complete search history.

(56) References Cited

U.S. PATENT DOCUMENTS

| | | | |
|---|---|---|---|
| 5,122,845 A | 6/1992 | Manabe et al. | |
| 5,247,533 A | 9/1993 | Okazaki et al. | |
| 5,290,393 A | 3/1994 | Nakamura et al. | |
| 5,306,662 A | 4/1994 | Nakamura et al. | |
| 5,563,422 A | 10/1996 | Nakamura et al. | |
| 5,652,434 A | 7/1997 | Nakamura et al. | |
| 5,733,796 A | 3/1998 | Manabe et al. | |
| 6,194,743 B1 | 2/2001 | Kondoh et al. | |
| 6,455,870 B1 | 9/2002 | Wang et al. | |
| 6,515,306 B2 | 2/2003 | Kuo et al. | |
| 7,193,246 B1 | 3/2007 | Tanizawa et al. | |
| 2001/0009134 A1 | 7/2001 | Kim et al. | |
| 2002/0179923 A1 | 12/2002 | Morita et al. | |

(Continued)

FOREIGN PATENT DOCUMENTS
JP    983016    3/1997
(Continued)

OTHER PUBLICATIONS
Kimimura et al., Machine Translation of JP 10-084159 A.*

*Primary Examiner* — Hung Vu
*Assistant Examiner* — Vernon P Webb
(74) *Attorney, Agent, or Firm* — Husch Blackwell LLP

(57) ABSTRACT

The present invention relates a III-nitride compound semiconductor light emitting device in which a first layer composed of a carbon-containing compound layer, such as an n-type or p-type silicon carbide (SiC), silicon carbon nitride (SiCN) or carbon nitride layer (CN) layer, is formed on the p-type III-nitride semiconductor layer of the existing III-nitride semiconductor light emitting device, and a second layer composed of a III-nitride semiconductor layer with a given thickness is formed on the first layer.

19 Claims, 7 Drawing Sheets

U.S. PATENT DOCUMENTS

| | | |
|---|---|---|
| 2004/0119082 A1* | 6/2004 | Sugawara ................. 257/94 |
| 2005/0157765 A1 | 7/2005 | Johnson |

FOREIGN PATENT DOCUMENTS

| | | |
|---|---|---|
| JP | 09-139543 | 5/1997 |
| JP | 9-260726 | 10/1997 |
| JP | 9266327 | 10/1997 |
| JP | 9-307190 | 11/1997 |
| JP | 9-326508 | 12/1997 |
| JP | 10084159 A * | 3/1998 |
| JP | 11-074622 | 3/1999 |
| JP | 2000-101135 | 4/2000 |
| JP | 2003150315 | 5/2003 |
| KR | 10-043346 | 7/1991 |
| KR | 1020010077971 | 8/2001 |
| KR | 1020040047132 | 6/2004 |
| KR | 10-448352 | 9/2004 |
| WO | WO-9946822 | 9/1999 |
| WO | WO-02/21121 | 3/2002 |
| WO | WO-2005034253 | 4/2005 |
| WO | WO-2005053042 | 6/2005 |

* cited by examiner

SiCN : 0A

SiCN : ~10A

SiCN : ~20A

III-NITRIDE COMPOUND SEMICONDUCTOR LIGHT EMITTING DEVICE

CROSS-REFERENCE TO PRIOR APPLICATION

This is a U.S. National Phase Application under 35 U.S.C. §371 of International Patent Application No. PCT/KR2005/000895, filed Mar. 25, 2005, which claims priority of Korean Patent Application No. 10-2004-0020270, filed Mar. 25, 2004, both of which are hereby incorporated by reference. The International Application published in English on Jan. 12, 2006 as WO 2006/004271 A1 under PCT Article 21(2).

TECHNICAL FIELD

The present invention relates to a III-nitride compound semiconductor light emitting device, and more particularly, to a III-nitride compound semiconductor light emitting device with improved external quantum efficiency, which has roughness in a nitride semiconductor layer.

As used herein, the term III-nitride compound semiconductor light emitting device refers to a light emitting device, such as a light emitting diode comprising a compound semiconductor layer made of $Al(x)Ga(y)In(1-x-y)N$ ($0 \leqq x \leqq 1$, $0 \leqq y \leqq 1$, $0 \leqq x+y \leqq 1$), and does not exclude the inclusion of either materials made of other group elements, such as SiC, SiN, SiCN, and CN, or a semiconductor layer made of such materials.

BACKGROUND ART

FIG. 1 shows a III-nitride compound semiconductor light emitting device according to the prior art. As shown in FIG. 1, the light emitting device comprises: a substrate 10; a buffer layer 11 epitaxially grown on the substrate 10; an n-type nitride semiconductor layer 12 epitaxially grown on the buffer layer 11, an active layer 13 epitaxially grown on the n-type nitride layer 12; a p-type nitride semiconductor layer 14 epitaxially grown on the active layer 13; a p-side electrode 17 formed on the p-type nitride semiconductor layer 14; a p-side bonding pad 15 formed on the p-side electrode 17; an n-side electrode 18 formed on the n-type nitride semiconductor layer 12 exposed by mesa-etching of at least the p-type nitride semiconductor layer 14 and the active layer 13; and a protection layer 16 formed on the p-side bonding pad 15, the p-side electrode 17 and the n-side electrode 18.

The substrate 10 can use a GaN-based substrate as a homogeneous substrate, and a sapphire substrate, a silicon carbide substrate or a silicon substrate as a heterogeneous substrate, but can use any other substrates on which nitride semiconductor layers can be grown.

The nitride semiconductor layers epitaxially grown on the substrate 10 are usually grown by means of MOCVD (Metal Organic Chemical Vapor Deposition) method.

The buffer layer 11 serves to reduce differences in lattice constant and the coefficient of thermal expansion between the heterogeneous substrate 10 and the nitride semiconductor. U.S. Pat. No. 5,122,845 discloses a technology in which an AlN buffer layer having a thickness of 100 Å to 500 Å is grown on a sapphire substrate at a temperature ranging from 380° C. to 800° C. U.S. Pat. No. 5,290,393 discloses a technology in which an $Al(x)Ga(1-x)N$ ($0 \leqq x < 1$) buffer layer having a thickness of 10 Å to 5000 Å is grown on a sapphire substrate at a temperature ranging from 200° C. to 900° C. Korean Patent No. 10-0448352 discloses a technology in which a SiC buffer layer is grown at a temperature ranging from 600° C. to 990° C., and an $In(x)Ga(1-x)N$ ($0 < x \leqq 1$) layer is grown on the SiC buffer layer.

In the n-type nitride semiconductor layer 12, at least a region (n-type contact layer) in which the n-side electrode 18 is formed is doped with an impurity. The n-type contact layer is preferably made of GaN and is doped with Si. U.S. Pat. No. 5,733,796 discloses a technology in which an n-type contact layer is doped with a desired doping concentration by controlling a mixing ratio of Si and other source materials.

The active layer 13 is a layer for emitting a photon (light) by recombination of electrons and holes, and is mainly made of $In(x)Ga(1-x)N$ ($0 < x \leqq 1$). The active layer 13 is composed of a single quantum well or multi quantum wells. WO02/021121 discloses a technology in which only some of a plurality of quantum wells and barrier layers are doped.

The p-type nitride semiconductor layer 14 is doped with an impurity such as Mg, and has a p-type conductivity through an activation process. U.S. Pat. No. 5,247,533 discloses a technology in which a p-type nitride semiconductor layer is activated by means of irradiation of electron beam. U.S. Pat. No. 5,306,662 discloses a technology in which a p-type nitride semiconductor layer is activated through annealing at a temperature of 400° C. or more. Korean Patent No. 10-043346 discloses a technology in which $NH_3$ and a hydrazine-based source material are used together as a nitrogen precursor for growing a p-type nitride semiconductor layer, so that the p-type nitride semiconductor layer has a p-type conductivity without an activation process.

The p-side electrode 17 serves to allow the current to be supplied to the entire p-type nitride semiconductor layer 14. U.S. Pat. No. 5,563,422 discloses a technology of a light-transmitting electrode, which is formed almost on the entire p-type nitride semiconductor layer, in ohmic contact with the p-type nitride semiconductor layer, and made of Ni and Au. U.S. Pat. No. 6,515,306 discloses a technology of a light-transmitting electrode made of ITO (Indium Tin Oxide), which is formed on the n-type superlattice layer formed on the p-type nitride semiconductor layer.

Meanwhile, the p-side electrode 17 can be formed to have such a thick thickness that the p-side electrode 17 does not transmit light, i.e., the p-side electrode 17 reflects light toward the substrate. A light emitting device using this p-side electrode 17 is called a flip chip. U.S. Pat. No. 6,194,743 discloses a technology of an electrode structure including an Ag layer of 20 nm or more in thickness, a diffusion barrier layer covering the Ag layer, and a bonding layer made of Au and Al, which covers the diffusion barrier layer.

P-side bonding pad 15 and n-side electrode 18 are for providing current into the device and for wire-bonding out of the device. U.S. Pat. No. 5,563,422 discloses a technology of an n-side electrode made of Ti and Al. U.S. Pat. No. 5,652,434 discloses a technology of p-side bonding pad directly contacted with p-type nitride semiconductor layer by partially removing the light-transmitting electrode.

One of unavoidable basic problems in the semiconductor light emitting device is that a phenomenon will occur where a significant portion of light generated in the semiconductor light emitting device is entrapped within the semiconductor light emitting device due to a difference in dielectric constant between the semiconductor light emitting device and the surrounding air. The material of a III-nitride semiconductor light emitting device also has a refractive index of about 2.5 which is 1.5 greater than a refractive index of 1 for the surrounding air. Due to this difference in refractive index, a significant portion of light emitted from the active layer of the III-nitride semiconductor light emitting device is entrapped and disappears as heat in the light emitting device. About 80% of light emitted from the active layer, as theoretically calculated, is entrapped and disappears in the light emitting device. To improve this light entrapment phenomenon is very important in that it can increase the external quantum efficiency of the light emitting device to maximize the output of the light emitting device.

In order to improve the external quantum efficiency, the chip configuration of the light emitting device is mechanically processed i the case of Cree Co. Also in some articles, the surface is made rough by a chemical etching or dry etching technique to improve the external quantum efficiency. Recently, the surface is also made rough by changing growth conditions, such as pressure, temperature and gas flow, in the growth of the p-type layer, while causing deterioration in the film quality. The above-mentioned mechanical processing is easy on a substrate, such as SiC, but almost impossible on a sapphire substrate with high strength. Also, the use of the chemical or dry etching technique has a limitation in area which can be made rough. Another problem is that the process becomes complicated since an etching process is further added to the existing LED (light emitting diode) process. Also, there are problems in the reproduction and uniformity of the etching process. Rather than methods requiring this additional process, it is preferable in view of a subsequent process to make the surface rough by changing growth conditions as described above. However, in the case of the method of making the surface rough by changing the growth conditions, the deterioration in the thin-film quality is unavoidable. Also, to achieve this improvement, a significantly thick layer must be formed. Accordingly, the growth of a layer with bad quality in more than certain thickness can increase the external quantum efficiency of the light emitting device, but cause a fatal problem in the reliability of the light emitting device.

DISCLOSURE

Technical Problem

It is an object of thee present invention to provide a III-nitride compound semiconductor light emitting device whose external quantum efficiency can be increased without causing damages to the electrical properties of the light emitting device.

Technical Solution

To achieve this object, the present invention provides a III-nitride compound semiconductor light emitting device in which a first layer composed of a carbon-containing compound layer, such as an n-type or p-type silicon carbide (SiC), silicon carbon nitride (SiCN) or carbon nitride layer (CN) layer, is formed on the p-type III-nitride semiconductor layer of the existing III-nitride semiconductor light emitting device, and a second layer composed of a III-nitride semiconductor layer with a given thickness is formed on the first s layer.

Advantageous Effects

According to the present invention, the external quantum efficiency of the light emitting device can be maximized by forming an effective roughness on an active layer by the peculiar method of the present invention. This is because the light emitting device according to the present invention has a structure where light emitted from the active layer can be refracted on the roughness surface while effectively getting out of the light emitting device.

MODE FOR INVENTION

Figure 1:
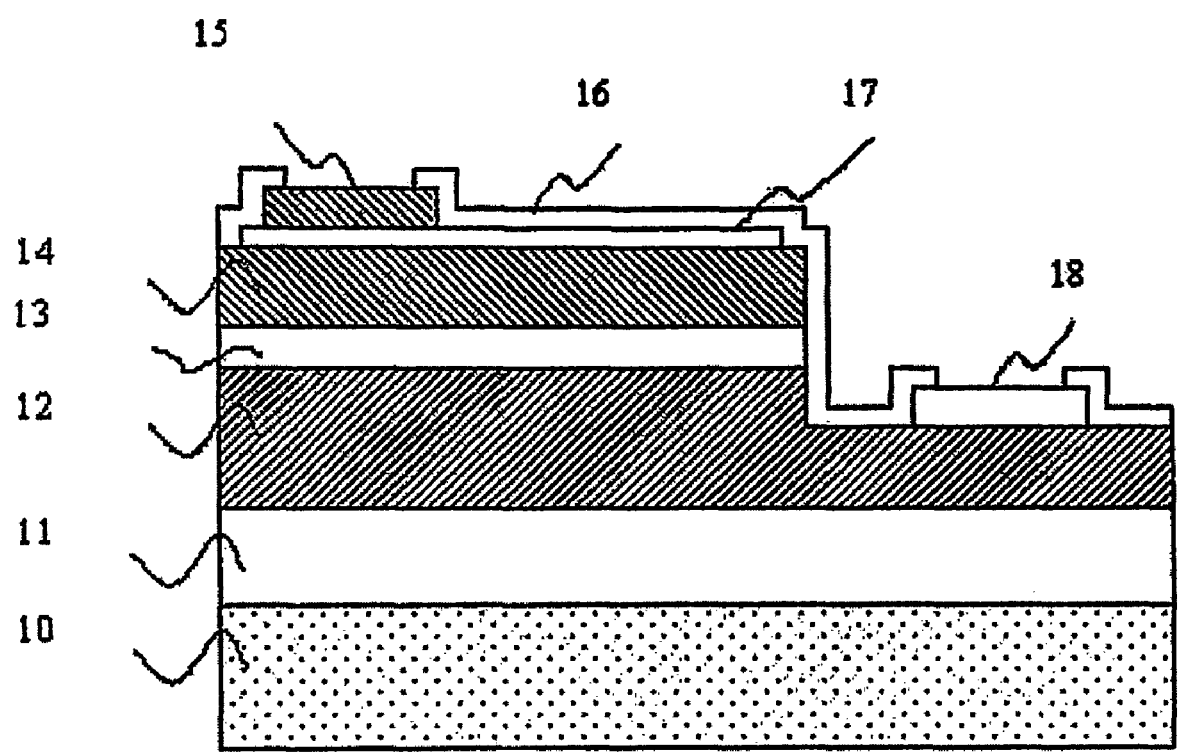
FIG. 1 is a view showing a III-nitride compound semiconductor light emitting device according to the prior art.
Figure 2:
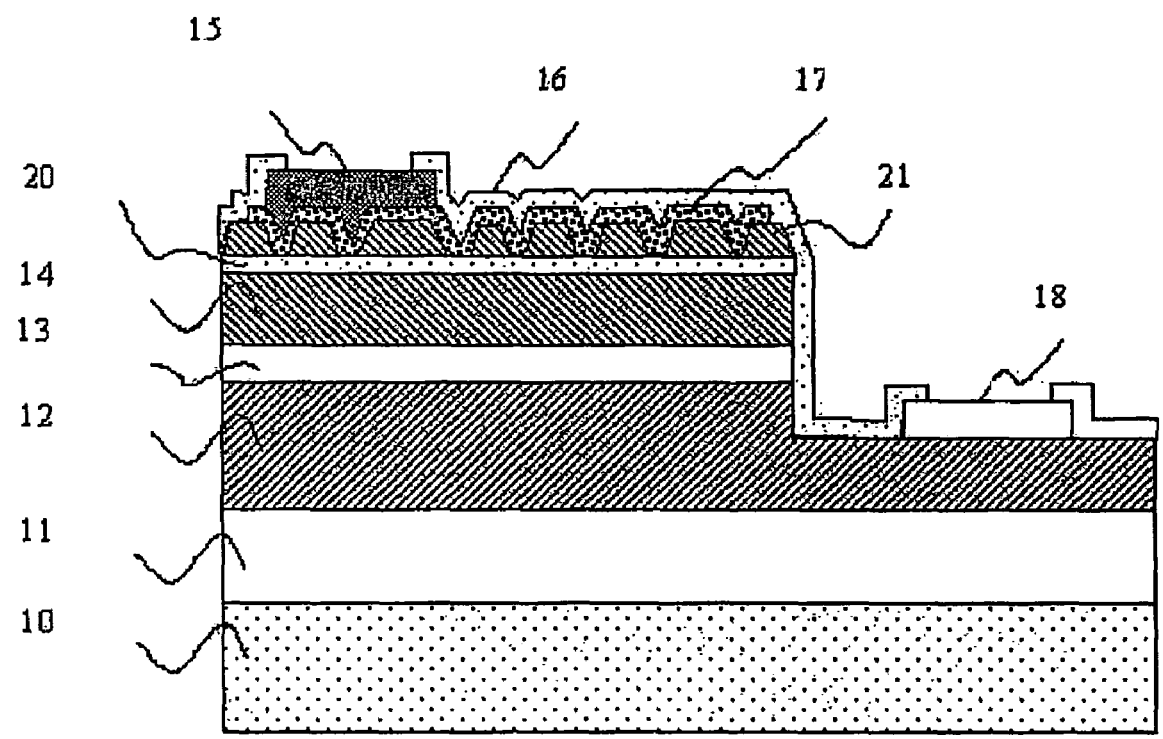
FIG. 2 is a representative view showing one example of a light emitting device according to the present invention.

FIG. 2 is a representative view showing one example of a light emitting device according to the present invention. As shown in FIG. 2, the first layer 20 composed of a silicon carbide (SiC), silicon carbon nitride (SiCN) or carbon nitride (CN) layer is typically grown on the existing p-type GaN 14, on which the III-nitride semiconductor layer 21 with roughness (protrusions and/or depressions). A p-side electrode 17 is formed on the first layer 20 and the III-nitride semiconductor layer 21. A substrate 10, a buffer layer 11, an n-type nitride semiconductor layer 12, an active layer 13, a p-type nitride semiconductor layer 14, a p-side bonding pad 15, an n-side electrode 18, and a protection layer 16 are substantially the same as those illustrated in FIG. 1.

A method of forming the first layer composed of the silicon carbide (SiC), silicon carbon nitride (SiCN) or carbon nitride (CN) layer on the p-type $Al(x)Ga(y)In(1-x-y)N$ ($0 \leq x \leq 1$, $0 \leq y \leq 1$, $0 \leq x+y \leq 1$) layer of the existing III-nitride semiconductor light emitting device will now be described in detail.

1) Formation of $Si_aC_b$ Layer

To form the SiC layer in the present invention, DTBSi, a kind of metal organic source, was used as a silicon source, and $CBr_4$, a kind of metal organic source, was used as a carbon source. The use of these sources provides an advantage in that all the two sources are easily thermally decomposed at low temperature so that they can form the SiC layer at a lower temperature than that in the use of a hydride source, such as $CH_4$ or $SiH_4$. However, in the present invention, sources used in forming the SiC layer are not limited to DTBSi and $CBr_4$. Important particulars in forming the SiC layer on the $Al(x)Ga(y)In(1-x-y)N$ ($0 \leq x \leq 1$, $0 \leq y \leq 1$, $0 \leq x+y \leq 1$) layer are the growth temperature and time of the SiC layer since a nitrogen source is not used during the growth of the SiC layer. If the growth temperature is excessively high or the growth time lengthens, a phenomenon will occur where N leave from the $Al(x)Ga(y)In(1-x-y)N$ ($0 \leq x \leq 1$, $0 \leq y \leq 1$, $0 \leq x+y \leq 1$) layer so as to cause the aggregation of metals, such as Al, In and Ga. When this metal aggregation phenomenon occurs, the growth of a high-quality thin film will become impossible and the characteristics (e.g., leakage current and reliability) of the resulting light emitting device will be adversely affected.

The SiC layer according to the present invention can be formed on the $Al(x)Ga(y)In(1-x-y)N$ ($0 \leq x \leq 1$, $0 \leq y \leq 1$, $0 \leq x+y \leq 1$) layer in various forms, such as amorphous, polycrystalline and mono crystalline forms, depending on conditions. Such crystalline forms can vary depending on the growth temperature of the SiC layer. In the case of the polycrystalline or mono crystalline forms, a and b in $Si_aC_b$ have other values than 0.

Moreover, the growth temperature of the SiC layer according to the present invention is preferably 500° C. to 1,100° C. since the growth temperature of the Al(x)Ga(y)In (1-x-y)N ($0 \leq x \leq 1$, $0 \leq y \leq 1$, $0 \leq x+y \leq 1$) layer is 1,000° C. to 1,200° C.

Also, the thickness of the SiC layer according to the present invention is preferably 5 Å to 1,000 Å. The larger the thickness, the surface roughness of the Al(x)Ga(y)In(1-x-y)N ($0 \leq x \leq 1$, $0 \leq y \leq 1$, $0 \leq x+y \leq 1$), layer to be formed thereon shows a tendency to be severe, however, if the SiC layer becomes excessively thick, the quality of the thin-film will become bad, and as described above, nitrogen will leave from the underlying Al(x)Ga(y)In(1-x-y)N ($0 \leq x \leq 1$, $0 \leq y \leq 1$, $0 \leq x+y \leq 1$) layer during the growth of the SiC layer so as to cause the metal aggregation phenomenon. For this reason, the thickness is preferably less than 1,000 Å.

The SiC layer according to the present invention may be composed of either a layer n-doped or p-doped with impurities (e.g., n-dopants: periodic table group V elements, and p-dopants: periodic table group III elements) or an n-type layer which has been intentionally undoped but spontaneously formed. The growth of an n-type SiC layer on a p-type Al(x)Ga(y)In(1-x-y)N ($0 \leq x \leq 1$, $0 \leq y \leq 1$, $0 \leq x+y \leq 1$) layer corresponds to the use of a tunneling effect.

2) Formation of $Si_cC_dN_e$

To form the SiCN layer in the present invention, DTBSi, a kind of metal organic source, was used as a silicon source, and $CBr_4$, a kind of metal organic source, was used as a carbon source, and ammonia or DMHy was used as a nitrogen source. As described above, the reason why these sources were used is that they are easily thermally decomposed at low temperature so that they can form the SiCN layer at a lower temperature than that in the use of the existing hydride source, such as $CH_4$ or $SiH_4$. However, in the present invention, sources used in forming the SiCN layer are not limited to DTBSi, $CBr_4$, and $NH_3$ or DMHy. The formation of the SiCN layer on the Al(x)Ga(y)In(1-x-y)N ($0 \leq x \leq 1$, $0 \leq y \leq 1$, $0 \leq x+y \leq 1$) layer has an advantage in that the metal aggregation phenomenon on the Al(x)Ga(y)In(1-x-y)N ($0 \leq x \leq 1$, $0 \leq y \leq 1$, $0 \leq x+y \leq 1$) layer can be inhibited during the growth of the thin film as compared to the formation of the SiC layer, since ammonia, a hydrazine-based source, or a mixture of ammonia and the hydrazine-based source is used as a nitrogen source. This can prevent nitrogen from leaving from the Al(x)Ga(y)In(1x-y)N ($0 \leq x \leq 1$, $0 \leq y \leq 1$, $0 \leq x+y \leq 1$) layer, since nitrogen groups are continuously supplied during the growth of the SiCN thin film. A disadvantage with the use of the SiCN layer compared to the SiC layer is that the composition thereof is complicated so that the reproduction of the thin film can be slightly reduced as compared to the SiC layer. However, with respect to the Al(x)Ga(y)In(1-x-y)N ($0 \leq x \leq 1$, $0 \leq y \leq 1$, $0 \leq x+y \leq 1$) layer to be grown thereon, there is no great difference between the SiC layer and the SiCN layer.

The SiCN layer according to the present invention may be formed on the Al(x)Ga(y)In(1-x-y)N ($0 \leq x \leq 1$, $0 \leq y \leq 1$, $0 \leq x+y \leq 1$) layer in various forms, such as amorphous, polycrystalline or monocrystalline forms, depending on conditions. In the case of the polycrystalline or monocrystalline form, c, d and e in $Si_cC_dN_e$ have other values than 0. Also, the growth temperature of the SiCN layer according to the present invention is preferably 500° C. to 1,000° C. since the growth temperature of the Al(x)Ga(y)In(1-x-y)N ($0 \leq x \leq 1$, $0 \leq y \leq 1$, $0 \leq x+y \leq 1$) layer is generally 1,000° C. to 1,200 Å.

Furthermore, the thickness of the SiCN layer according to the present invention is preferably 5 Å to 1,000Å. The larger the thickness, the surface roughness of the Al(x)Ga(y)In(1-x-y)N ($0 \leq x \leq 1$, $0 \leq y \leq 1$, $0 \leq x+y \leq 1$) layer to be grown thereon shows a tendency to be severe, however, if the SiCN layer becomes excessively thick, the quality of the thin film will become bad. For this reason, the thickness is preferably less than 1,000 Å.

The SiCN layer according to the present invention may be composed of either a layer n-doped or p-doped with impurities (e.g., n-dopants: periodic table group V elements, and p-dopants: periodic table group III elements) or an n-type layer which has been intentionally undoped but spontaneously formed. The growth of an n-type SiCN layer on a p-type Al(x)Ga(y)In(1-x-y)N ($0 \leq x \leq 1$, $0 \leq y \leq 1$, $0 \leq x+y \leq 1$) layer corresponds to the use of a tunneling effect.

3) Formation of $C_fN_g$ Layer

To form the CN layer in the present invention, $CBr_4$, a kind of metal organic source, was used as a carbon source, and ammonia, a hydrazine-based source or a mixture of ammonia and the hydrazine-based source was used as a nitrogen source. The use of $CBr_4$ provides an advantage in that it is easily thermally decomposed at low temperature so that it can form a CN layer at low temperature. However, in the present invention, a carbon source used in forming the CN layer is not limited only to $CBr_4$. The CN layer has an advantage in that a problem, such as the leaving of nitrogen from the underlying Al(x)Ga(y)In(1-x-y)N ($0 \leq x \leq 1$, $0 \leq y \leq 1$, $0 \leq x+y \leq 1$) layer, does not occur during the growth of the CN layer unlike the SiC layer, since the nitrogen sources (ammonia and hydrazine-based source) is continuously supplied during the growth of the thin film.

The CN layer according to the present invention may be formed on the Al(x)Ga(y)In(1-x-y)N ($0 \leq x \leq 1$, $0 \leq y \leq 1$, $0 \leq x+y \leq 1$) layer in various forms, such as amorphous, polycrystalline or mono crystalline forms, depending on conditions. These crystalline forms may vary depending on conditions, such as the growth temperature of the CN layer. In the case of the polycrystalline or monocrystalline form, f and g in the $C_fN_g$ layer have other values than 0.

Also, the growth temperature of the $C_fN_g$ layer according to the present invention is preferably 500° C. to 1,000° C. since the growth temperature of the Al(x)Ga(y)In (1-x-y)N ($0 \leq x \leq 1$, $0 \leq y \leq 1$, $0 \leq x+y \leq 1$) layer is generally 1,000° C. to 1,200° C.

Furthermore, the thickness of the $C_fN_g$ layer according to the present invention is preferably 5 Å to 1,000 Å. The larger the thickness, the roughness of the Al(x)Ga(y)In(1-xy)N ($0 \leq x \leq 1$, $0 \leq y \leq 1$, $0 \leq x+y \leq 1$) layer to be grown thereon shows a tendency to be severe, however, if the SiCN layer becomes excessively thick, the quality of the thin-film will become bad. This is mainly because of the lattice mismatch between the $C_fN_g$ layer and the Al(x)Ga(y)In(1-x-y)N ($0 \leq x \leq 1$, $0 \leq y \leq 1$, $0 \leq x+y \leq 1$) layer.

The $C_fN_g$ layer according to the present invention may be composed of either a layer n-doped or p-doped with Impurities (e.g., n-dopants: periodic table group V elements, and p-dopants: periodic table group III elements) or an n-type layer which has been intentionally undoped but spontaneously formed. The growth of an n-type C;N g layer on a p-type Al(x)Ga(y)In(1-x-y)N ($0 \leq x \leq 1$, $0 \leq y \leq 1$, $0 \leq x+y \leq 1$) layer corresponds to the use of a tunneling effect.

Figure 3:
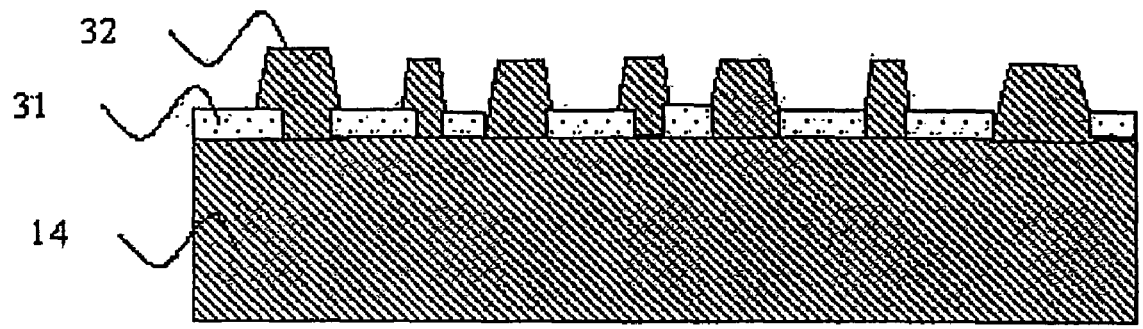
FIGS. 3 to 5 shows cross-sectional views of the first layer and the second layer formed in accordance with the present invention.
Figure 4:
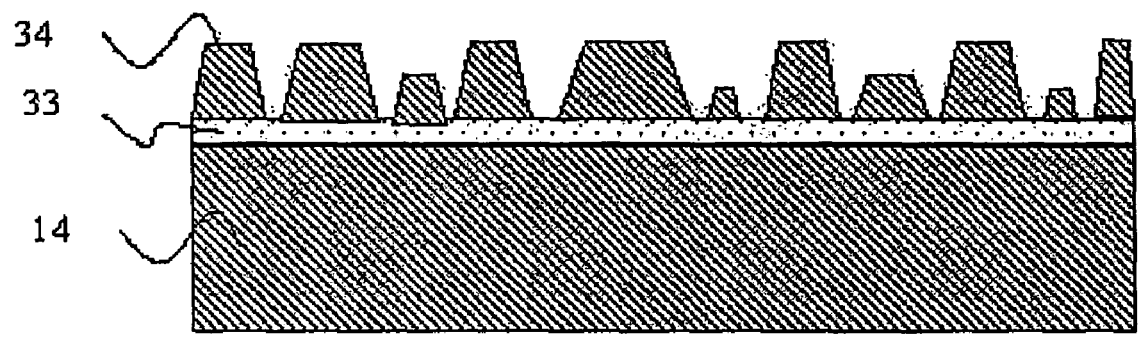
Figure 5:
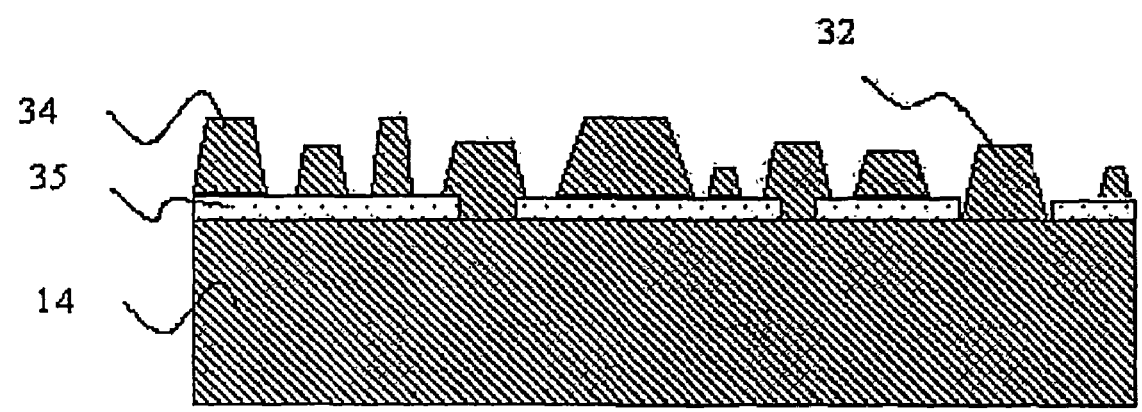

The first layer composed of the n-type or p-type silicon carbide layer (SiC), silicon carbon nitride (SiCN) or carbon nitride (CN) layer as described above can be formed as a uniform or nonuniform layer as shown in FIGS. 3 to 5. The formation of this uniform or nonuniform layer can be determined depending on the thickness and thin-film quality of the first layer. For example, the first layer is made of materials completely different from the underlying AlInGaN layer, and thus, if it is grown in a single crystalline form, it can be grown into a nonuniform layer. FIG. 3 shows the protrusions 32 of the AlInGaN layer formed with roughness between the films of the first layer 31 discontinuously formed. FIG. 4 shows the protrusions 34 of the AlInGaN layer formed with roughness on the first layer 33 uniformly formed. FIG. 5 shows the protrusions 32 and 34 of the AlInGaN layer formed with roughness between and on the films of the first layer 35. The inventive structures with roughness may include all the three cases of FIG. 3 to FIG. 5.

Characteristics in forming the first layer composed of the n-type or p-type silicon carbide (SiC), silicon carbon nitride (SiCN) or carbon nitride (CN) layer on the P-AlInGaN layer of the existing III-nitride and forming the second layer composed of the P-Al$_x$Ga$_y$In$_z$N layer on the first layer will now be described.

As shown in FIGS. 3 to 5, when the second layer 21 made of Al(x)Ga(y)In(1-x-y)N (0≦x≦1, 0≦y≦1, 0≦x+y≦1) is grown on the first layer composed of the n-type or p-type silicon carbide (SiC), silicon carbon nitride (SiCN) or carbon nitride (CN) layer, the second layer 21 will aggregate in an island configuration due to a difference in material characteristics (e.g., lattice constant) between the two layers. This is easily understood when imagining a phenomenon where if water is spilt on a material which is not easily wetted, water will aggregate in drops.

When the first layer is the nonuniform layer 31 as shown in FIG. 3, the second layer composed of the Al(x)Ga(y)In(1-x-y)N (0≦x≦1, 0≦y≦1, 0≦x+y≦1) layer will be grown with respect to grooves while forming roughness. When the first layer is the uniform layer 33, initial seeds of Al(x)Ga(y)In(1-x-y)N (0≦x≦1, 0≦y≦1, 0≦x+y≦1) will be randomly formed on the first layer, and roughness will be formed in the configuration of the islands 34 with respect to the seeds.

The surface roughness can be adjusted according to the thin-film thickness of the second layer, and the thickness of the first layer also performs an important role in the surface roughness.

Figure 6:
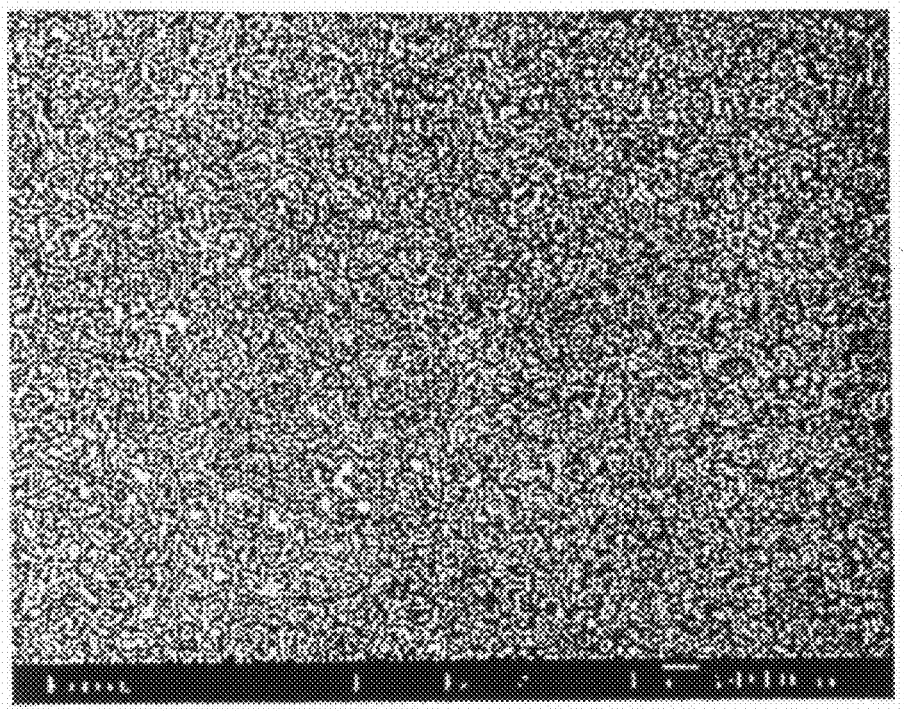
FIG. 6 shows scanning electron microscope (SEM) images of the surface of the device formed in accordance with the present invention.
Figure 6:
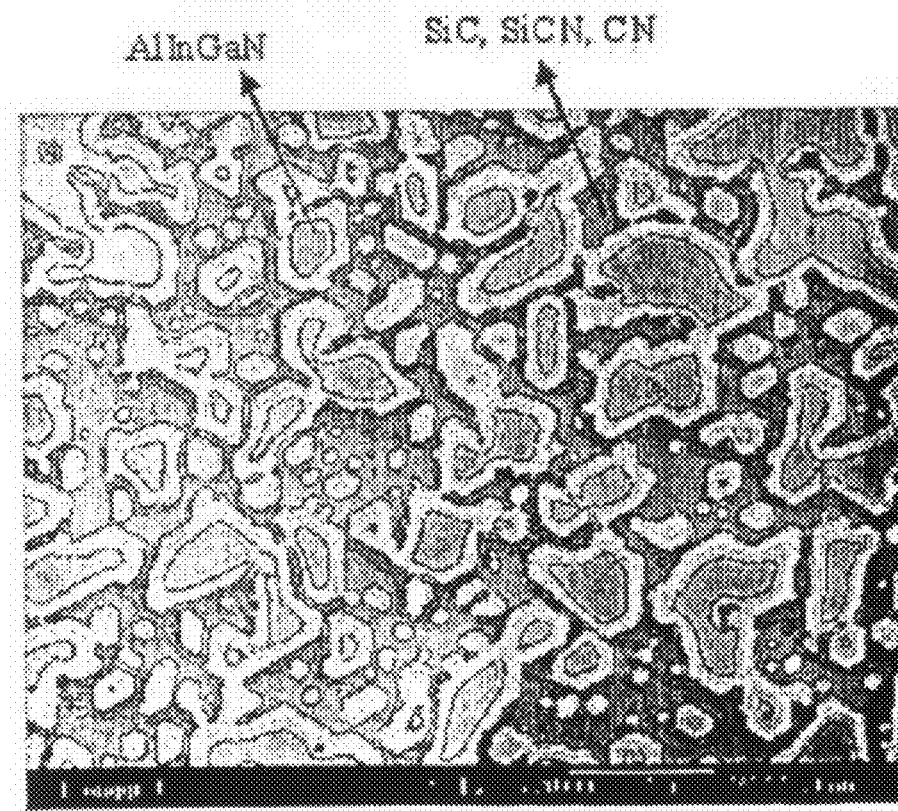

FIG. 6 shows scanning electron microscope (SEM) images of the Al(x)Ga(y)In(1-x-y)N (0≦x≦1, 0≦y≦1, 0≦x+y≦1) layer with roughness (protrusions and/or depressions) formed according to the present invention. The light portions in FIG. 6 is the Al(x)Ga(y)In(1-x-y)N (0≦x≦1, 0≦y≦1, 0≦x+y≦1) layer formed in an island configuration, and the dark portions are portions corresponding to the first layer. These portions have a size ranging from several thousands Angstroms to 10 microns and various shapes. The size and shape of these portions may vary depending on the thickness of the grown Al(x)Ga(y)In(1-x-y)N (0≦x≦1, 0≦y≦1, 0≦x+y≦1) layer. As described above, the roughness so formed can maximize the external quantum efficiency of light emitted from the active layer.

Figure 7:
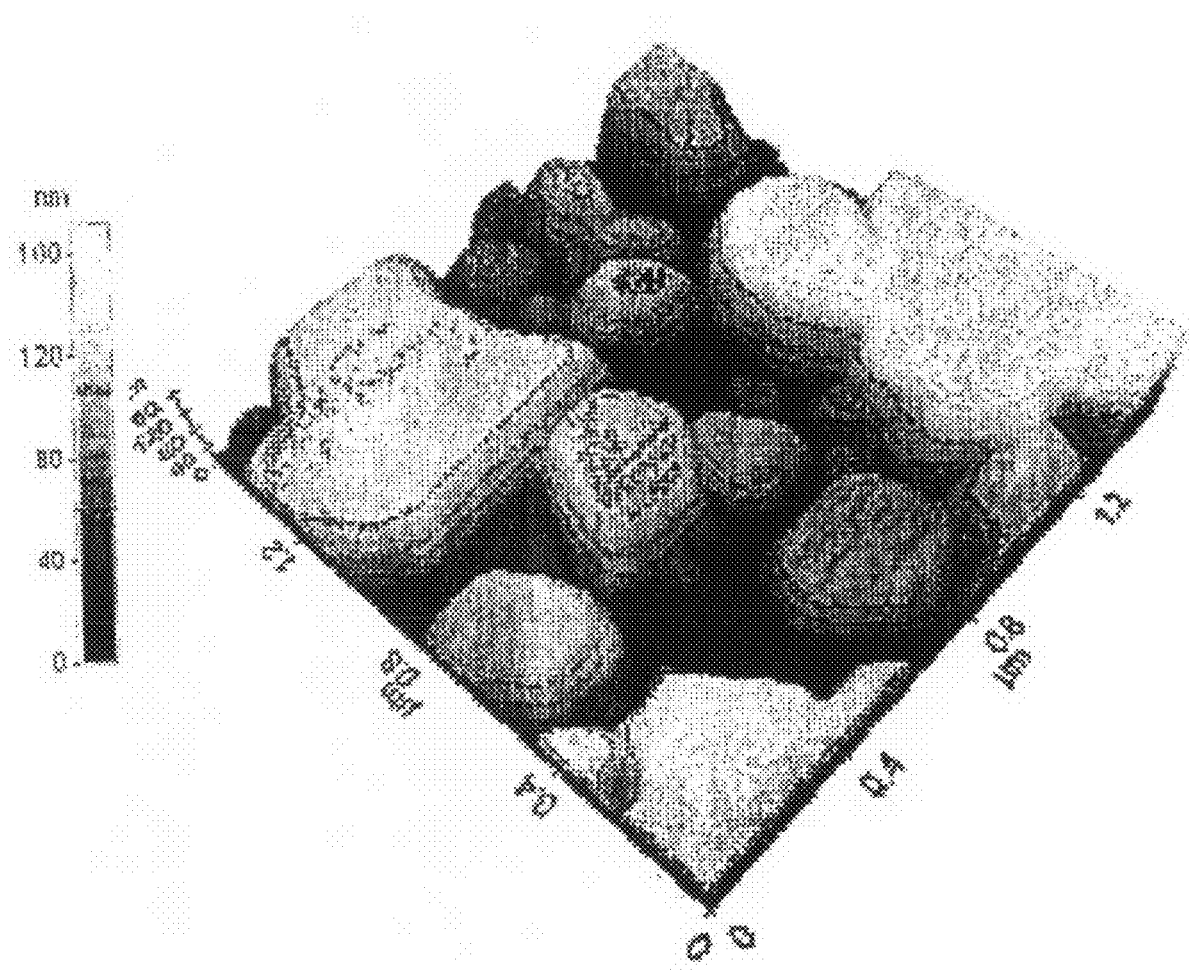
FIGS. 7 and 8 show surface images of the device formed in accordance with the present invention, measured by AFM equipment.
Figure 8:
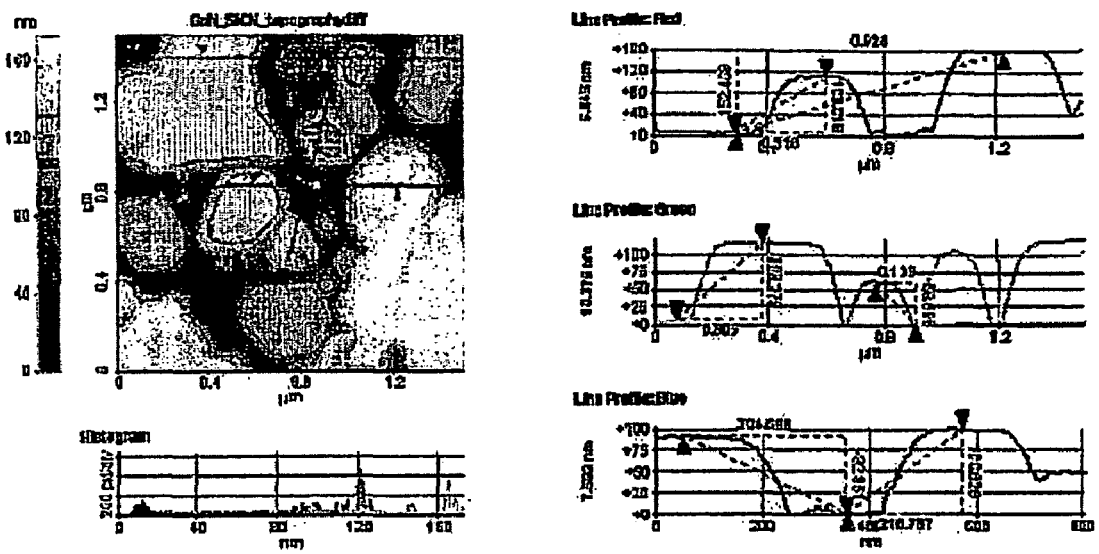

FIGS. 7 and 8 show surface images measured by AFM equipment for roughness formed according to the present invention. The AFM equipment allows the three dimensional image of a narrower region to be precisely obtained unlike the above-mentioned SEM equipment. FIG. 7 shows a surface image of a 1.5×1.5 um region with roughness. As can be seen in FIG. 7, the roughness portions have a size of several hundreds Angstroms to 10 microns and various shapes. FIG. 8 shows a cross-sectional profile of the image shown in FIG. 7. As can be seen in FIG. 8, the cross-section of the fine roughness structures is trapezoid in shape. Also, the inclined angle of the roughness surface is 10° to 60° or greater. Thus, this inclined surface will change the directional angle of incident light, thus increasing the external quantum efficiency of the light.

Figure 9:
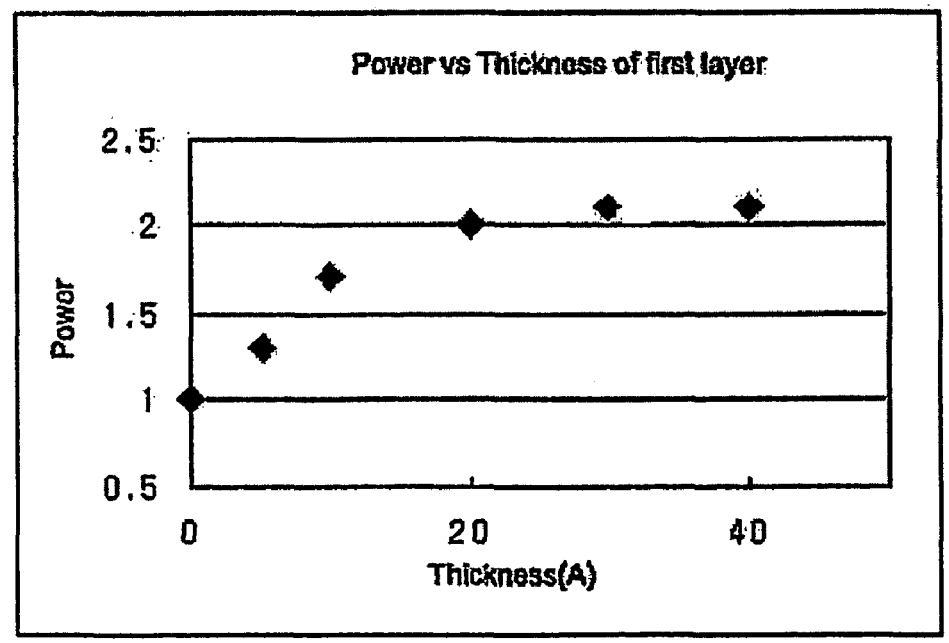
FIG. 9 is a graph showing an increase in light output with an increase in the thickness of the first layer of the inventive light emitting device; and, FIG. 10 is photographs showing the surface roughness as a function of the thickness of the first layer of the present invention.

FIG. 9 is a graph showing an increase in light output with an increase in the thickness of the first layer 20 of the inventive light emitting device with roughness. As can be seen in FIG. 9, the maximum light output of the inventive light emitting device is at least two times higher than the existing light emitting device with no roughness.

Figure 10:
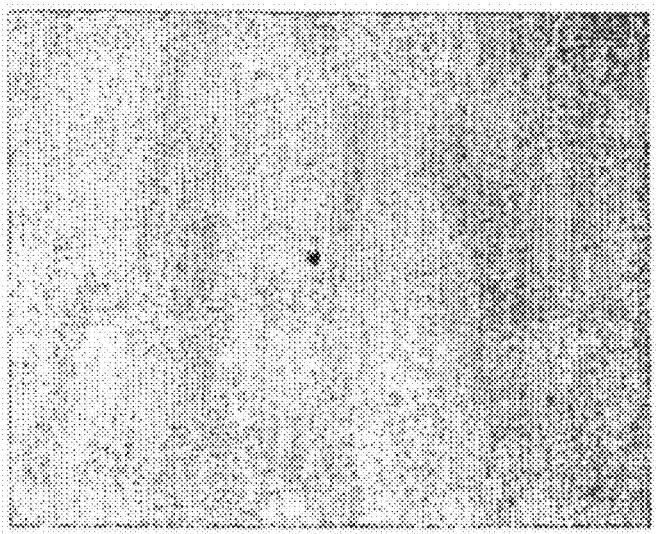
Figure 10:
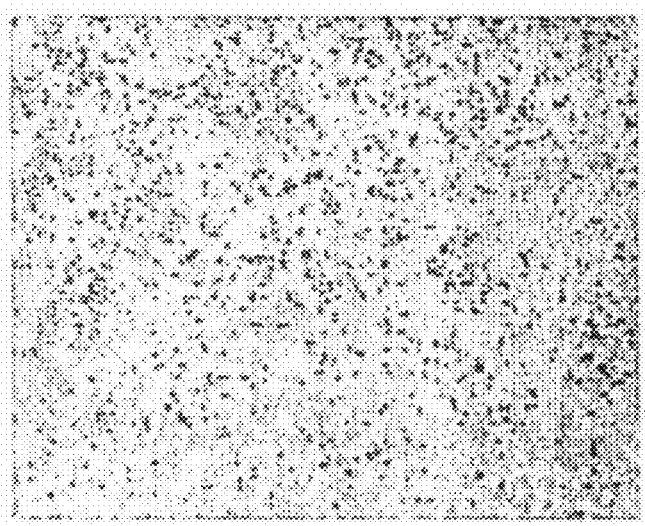
Figure 10:
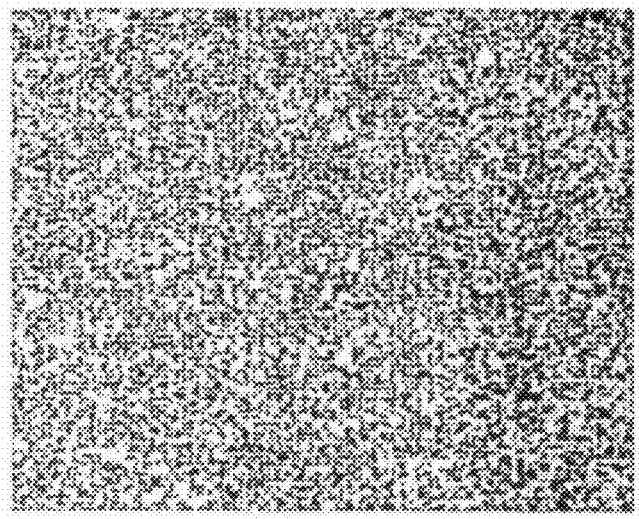

FIG. 10 shows scanning electron microscope photographs showing the surface roughness as a function of the thickness of the first layer. The first photograph is a surface photograph of a normal light emitting diode, the second photograph is for the case where the SiC layer has been formed in a thickness of about 10 Angstroms, and the third photograph is for the case where the SiC layer has been formed in a thickness of about 20 Angstroms. In this regard, the thickness of the SiC layer is expected based on the growth rate, and can slightly differ from an actual value. As shown in FIG. 10, the larger the thickness of the SiC layer, the surface roughness increases.

The light emitting diode with roughness according to the present invention can be fabricated by methods described in the following examples.

EXAMPLE 1

A III-nitride compound semiconductor light emitting device is fabricated by forming a first layer composed of an n-type silicon carbide (Si$_a$C$_b$), n-type silicon carbon nitride (Si$_c$C$_d$N$_e$) or n-type carbon nitride (C$_f$N$_g$) (a, b, c, d, e, f, and g are not 0) layer on a p-type GaN layer forming the existing upper p-side electrode contact layer in a thickness of 5 Å to 1000 Å and growing a second layer composed of a p-type GaN layer on the first layer in a thickness of 100 Å to 5,000 Å.

EXAMPLE 2

A III-nitride compound semiconductor light emitting device is fabricated by forming a first layer composed of a p-type silicon carbide (Si$_a$C$_b$), p-type silicon carbon nitride (Si$_c$C$_d$N$_e$) or p-type carbon nitride (C$_f$N$_g$) (a, b, c, d, e, f, and g are not 0) layer on a p-type GaN layer forming the existing upper p-side electrode contact layer in a thickness of 5 Å to 1000 Å and growing a second layer composed of a p-type GaN layer on the first layer in a thickness of 100 Å to 5,000 Å.

EXAMPLE 3

A III-nitride compound semiconductor light emitting device is fabricated by forming a first layer composed of an n-type silicon carbide (Si$_a$C$_b$), n-type silicon carbon nitride (Si$_c$C$_d$N$_e$) or n-type carbon nitride (C$_f$N$_g$) (a, b, c, d, e, f, and g are not 0) layer on a p-type GaN layer forming the existing upper p-side electrode contact layer in a thickness of 5 Å to 1000 Å and growing a second layer composed of a p-type GaN layer on the first layer in a thickness of 100 Å to 5,000 Å and growing a third layer composed of an n-type GaN layer on the second layer in a thickness of 5 Å to 200 Å. In this case, the third layer is a layer formed using the concept of a tunneling effect.

EXAMPLE 4

A III-nitride compound semiconductor light emitting device is fabricated by forming a first layer composed of a p-type silicon carbide (Si$_a$C$_b$), p-type silicon carbon nitride (Si$_c$C$_d$N$_e$) or p-type carbon nitride (C$_f$N$_g$) (a, b, c, d, e, f, and g are not 0) layer on a p-type GaN layer forming the existing upper p-side electrode contact layer in a thickness of 5 Å to 1000 Å growing a second layer composed of a p-type GaN layer on the first layer in a thickness of 100 Å to 5,000 Å and growing a third layer composed of an n-type GaN layer on the second layer in a thickness of 5 Å to 200 Å. In this case, the third layer is a layer formed using the concept of a tunneling effect.

EXAMPLE 5

Each of the light emitting devices described in Examples 1, 2, 3 and 4 is characterized in that the surface layer electrode is made of anyone selected from the group consisting of nickel, gold, silver, chrome, titanium, platinum, palladium, rhodium, iridium, aluminum, tin, ITO, indium, tantalum, copper, cobalt, iron, ruthenium, zirconium, tungsten, and molybdenum.

Also, the second and third layers may be made of Al(x)Ga(y)In(1-x-y)N ($0 \leq x \leq 1$, $0 \leq y \leq 1$, $0 \leq x+y \leq 1$), in addition to GaN.

One that a person skilled in the art should take notice in understanding the means of the thickness of the first and second layers described in Examples is how the thickness of the second layer is to be understood when the first layer is a nonuniform layer, in which case the thickness of the second layer may be understood to be a thickness from the surface of the first layer, assuming that the first layer is a uniform layer. The addition of this description by the applicant is to avoid useless disputes in analysis related with the thickness of the first and second layers, since growing the first layer in the form of an ideal uniform layer is not easy in view of the characteristics of the present invention using a difference in material characteristics between the carbon-containing compound and the III-nitride compound semiconductor and also not essential in the present invention.

The invention claimed is:

1. A III-nitride compound semiconductor light emitting device including an n-type III-nitride semiconductor layer, an active layer made of III-nitride semiconductor and deposited over the n-type III-nitride semiconductor layer, a p-type III-nitride semiconductor layer deposited over the active layer made of III-nitride semiconductor, and a p-side electrode deposited over the p-type III-nitride semiconductor layer, the light emitting device comprising:
    a first layer composed of a carbon-containing compound layer, the first layer interposed between the p-type III-nitride semiconductor layer and the p-side electrode, and the first layer being grown on the p-type III-nitride semiconductor layer;
    a second layer composed of a III-nitride semiconductor layer, the second layer including a plurality of island-like protrusions, each of the protrusions being formed on a top surface of the first layer; and
    the p-side electrode being formed on said second layer.

2. The III-nitride compound semiconductor light emitting device of claim 1, wherein the first layer is one selected from the group consisting of silicon carbide ($Si_aC_b$; a,b≠0), silicon carbon nitride ($Si_cC_dN_e$; c,d,e≠0) and carbon nitride ($C_fN_g$; f,g≠0).

3. The III-nitride compound semiconductor light emitting device of claim 2, wherein the n-type III-nitride semiconductor layer, the active layer made of III-nitride semiconductor, the p-type III-nitride semiconductor layer, and the second layer is composed of Al(x)Ga(y)In(1-x-y)N ($0 \leq x \leq 1$, $0 \leq y \leq 1$, $0 \leq x+y \leq 1$), and wherein the second layer is grown in a form of a plurality of islands due to different material characteristics between the first layer and the second layer.

4. The III-nitride compound semiconductor light emitting device of claim 2, wherein the second layer is a p-type III-nitride semiconductor layer.

5. The III-nitride compound semiconductor light emitting device of claim 3, wherein the second layer is made of a p-type Al(x)Ga(y)In(1-x-y)N ($0 \leq x \leq 1$, $0 \leq y \leq 1$, $0 \leq x+y \leq 1$).

6. The III-nitride compound semiconductor light emitting device of claim 2, wherein the first layer is in a thickness of 5 Å to 1000 Å.

7. The III-nitride compound semiconductor light emitting device of claim 2, wherein the growth temperature of the first layer is 500° C. to 1,100° C.

8. The III-nitride compound semiconductor light emitting device of claim 2, wherein the first layer is a p-type carbon-containing compound layer.

9. The III-nitride compound semiconductor light emitting device of claim 2, wherein the first layer is an n-type carbon-containing compound layer.

10. The III-nitride compound semiconductor light emitting device of claim 2, wherein the first layer is formed as a nonuniform layer.

11. The III-nitride compound semiconductor light emitting device of claim 2, wherein the first layer is formed as a uniform layer.

12. The III-nitride compound semiconductor light emitting device of claim 2, wherein the second layer is in a thickness of 100 Å to 5000 Å.

13. The III-nitride compound semiconductor light emitting device of claim 5, further comprising:
    a third layer made of Al(x)Ga(y)In(1-x-y)N ($0 \leq x \leq 1$, $0 \leq y \leq 1$, $0 \leq x+y \leq 1$) and formed on the second layer.

14. The III-nitride compound semiconductor light emitting device of claim 13, wherein the third layer is in a thickness of 5 Å to 200 Å.

15. The III-nitride compound semiconductor light emitting device of claim 2, wherein the p-side electrode is made of anyone selected from the group consisting of nickel, gold, silver, chrome, titanium, platinum, palladium, rhodium, iridium, aluminum, tin, ITO, indium, tantalum, copper, cobalt, iron, ruthenium, zirconium, tungsten, and molybdenum.

16. The III-nitride compound semiconductor light emitting device of claim 2, wherein the silicon source for growing the first layer is any one selected from the group consisting of $SiH_4$, $Si_2H_8$, and DTBSi, the carbon source for growing the first layer is anyone selected from the group consisting of $CH_4$, $C_2H_4$, and $CBr_4$, and the nitrogen source for growing the first layer is anyone selected from the group consisting of $NH_3$, and Hydrazine-based source material.

17. A III-nitride compound semiconductor light emitting device comprising:
    a substrate;
    a buffer layer deposited on the substrate;
    an n-type Al(x)Ga(y)In(1-x-y)N ($0 \leq x \leq 1$, $0 \leq y \leq 1$, $0 \leq x+y \leq 1$) layer deposited on the buffer layer;
    an Al(x)Ga(y)In(1-x-y)N ($0 \leq x \leq 1$, $0 \leq y \leq 1$, $0 \leq x+y \leq 1$) active layer deposited on the n-type Al(x)Ga(y)In(1-x-y)N ($0 \leq x \leq 1$, $0 \leq y \leq 1$, $0 \leq x+y \leq 1$) layer;
    an p-type Al(x)Ga(y)In(1-x-y)N ($0 \leq x \leq 1$, $0 \leq y \leq 1$, $0 \leq x+y \leq 1$) layer deposited on the Al(x)Ga(y)In(1-x-y)N ($0 \leq x \leq 1$, $0 \leq y \leq 1$, $0 \leq x+y \leq 1$) active layer;
    a first layer made of one selected from the group consisting of silicon carbide ($Si_aC_b$; a,b≠0), silicon carbon nitride ($Si_cC_dN_e$; c,d,e≠0) and carbon nitride ($C_fN_g$; f,g≠0), and grown on the p-type Al(x)Ga(y)In(1-x-y)N ($0 \leq x \leq 1$, $0 \leq y \leq 1$, $0 \leq x+y \leq 1$) layer;

a second layer made of p-type Al(x)Ga(y)In(1-x-y)N (0≦x≦1, 0≦y≦1, 0≦x+y≦1), composed of a plurality of islands for increasing external quantum efficiency, and formed on the first layer;
a p-side electrode deposited on the second layer; and,
an n-side electrode deposited on the n-type Al(x)Ga(y)In(1-x-y)N (0≦x≦1, 0≦y≦1, 0≦x+y≦1) layer.

18. The III-nitride compound semiconductor light emitting device of claim 17, wherein the p-type Al(x)Ga(y)In(1-x-y)N (0≦x≦1, 0≦y≦1, 0≦x+y≦1) layer and the second layer made of p-type Al(x)Ga(y)In(1-x-y)N (0≦x≦1, 0≦y≦1, 0≦x+y≦1) are made of GaN.

19. The III-nitride compound semiconductor light emitting device of claim 17, wherein the light emitting device is a light emitting diode.

* * * * *